United States Patent
Alluri et al.

(10) Patent No.: US 6,583,057 B1
(45) Date of Patent: Jun. 24, 2003

(54) METHOD OF FORMING A SEMICONDUCTOR DEVICE HAVING A LAYER DEPOSITED BY VARYING FLOW OF REACTANTS

(75) Inventors: Prasad Alluri, Austin, TX (US); Ramachandran Muralidhar, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/211,165

(22) Filed: Dec. 14, 1998

(65) Prior Publication Data (65)

(51) Int. Cl.[7] ............................................... H01L 21/00
(52) U.S. Cl. ...................... 438/653; 438/687; 438/688; 427/255.32
(58) Field of Search ................................ 438/653, 687, 438/688, 656, 597, 627, 643, 654, 788, 792, 569, 571, 573, 574; 427/255, 225, 250, 249, 248

(56) References Cited

U.S. PATENT DOCUMENTS

| | | | |
|---|---|---|---|
| 4,557,950 A | * | 12/1985 | Foster et al. ................. 427/255 |
| 4,734,340 A | * | 3/1988 | Saito et al. .................. 428/698 |
| 4,824,697 A | * | 4/1989 | Ishihara et al. .............. 427/255 |
| 5,276,012 A | * | 1/1994 | Ushida et al. ................. 505/1 |
| 5,308,788 A | * | 5/1994 | Fitch et al. ................... 437/81 |
| 5,679,815 A | * | 10/1997 | Kirlin et al. .................. 556/42 |
| 5,755,886 A | * | 5/1998 | Wang et al. ................. 118/715 |
| 5,786,027 A | * | 7/1998 | Rolfson ...................... 427/124 |
| 5,871,811 A | * | 2/1999 | Wang et al. ................. 427/248 |
| 5,919,522 A | * | 7/1999 | Baum et al. ................. 427/248 |
| 5,972,430 A | * | 10/1999 | DiMeo, Jr. et al. ......... 427/255.32 |
| 5,983,906 A | * | 11/1999 | Zhao et al. .................. 134/1.1 |
| 6,026,762 A | * | 2/2000 | Kao et al. ................... 118/723 |
| 6,037,001 A | * | 3/2000 | Kaloyeros et al. .......... 427/250 |
| 6,066,196 A | * | 5/2000 | Kaloyeros et al. ......... 106/1.18 |
| 6,117,769 A | * | 9/2000 | Nogami et al. ............. 438/653 |
| 6,121,163 A | * | 9/2000 | Gupta et al. ................ 438/788 |

* cited by examiner

*Primary Examiner*—Olik Chaudhuri
*Assistant Examiner*—Laura Schillinger
(74) *Attorney, Agent, or Firm*—Kim-Marie Vo; Robert A. Rodriquez

(57) ABSTRACT

A method of forming a semiconductor device by placing a semiconductor substrate in a vacuum chamber and subjecting the semiconductor substrate (20) to a sub-atmospheric pressure, and depositing a layer (40) on the semiconductor substrate while maintaining the sub-atmospheric pressure. Deposition of the layer (40) is carried out by sequentially (i) flowing a first reactant into the vacuum chamber at a first flow rate, (ii) reducing flow of the first reactant into the vacuum chamber to a second flow rate, and (iii) increasing flow of the first reactant into the vacuum chamber to a third flow rate.

25 Claims, 3 Drawing Sheets

METHOD OF FORMING A SEMICONDUCTOR DEVICE HAVING A LAYER DEPOSITED BY VARYING FLOW OF REACTANTS

BACKGROUND OF THE INVENTION

Semiconductor devices continue to be scaled to smaller dimensions. The reduction in size of circuitry such as capacitors and dynamic random access memory (DRAM) bit cells, has prompted a need to integrate high dielectric constant materials into the fabrication of such devices. Barium strontium titanium oxide (BST) and similar materials are high dielectric constant (high-K) materials currently being used as part of this integration scheme.

The present inventors have recognized that at high temperatures, BST chemical vapor deposition processes are mass transfer limited, where species react as soon as they land on the substrate surface on which they are being deposited. In the mass transfer limited process, there is sufficient energy in the system such that reaction takes place immediately upon components contacting an area for nucleation and growth. Such immediate reaction results in poor step coverage of the deposited film. In an attempt to obviate the negative effects of mass transfer limited reactions, the present inventors have considered reducing temperature to move the process from a mass-transfer-limited regime to a reaction-limited regime. In the reaction-limited regime the reaction occurs slowly enough such that the species can diffuse across the surface of a feature before the reaction occurs, thereby producing improved step coverage. However, operating at a low temperature results in a lower deposition rate of the film and poor crystallinity of the film. In addition, operating at low temperatures results in impurities, such as carbon, being trapped in the deposited film. One method of overcoming the problems with poor crystallinity associated with low temperature deposition processes includes removing the wafer from the chamber and annealing it at a high temperature. This can recrystallize the BST film thereby achieving desired electrical properties. However, this additional processing step introduces new integration problems.

Shown in FIG. 1 is an illustration of a semiconductor device substrate 10 having a capacitor dielectric 124 overlying a bottom electrode layer or post 122. As illustrated in FIG. 1, the step coverage of the capacitor dielectric 124 is such that the sidewall thickness is less than the thickness of the film overlying the top portions of electrode post 124, due to mass transfer limited deposition. Non-uniform thickness of the dielectric overlying the capacitor electrode can produce problems with leakage in areas where the dielectric is too thin. Attempting to overcome the leakage problems by increasing the overall dielectric thickness reduces the capacitance of the device, and is thus undesirable.

In view of the foregoing, it is desirable to deposit films having superior quality in semiconductor devices.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the present invention.

DETAILED DESCRIPTION OF THE DRAWINGS

Figure 1:
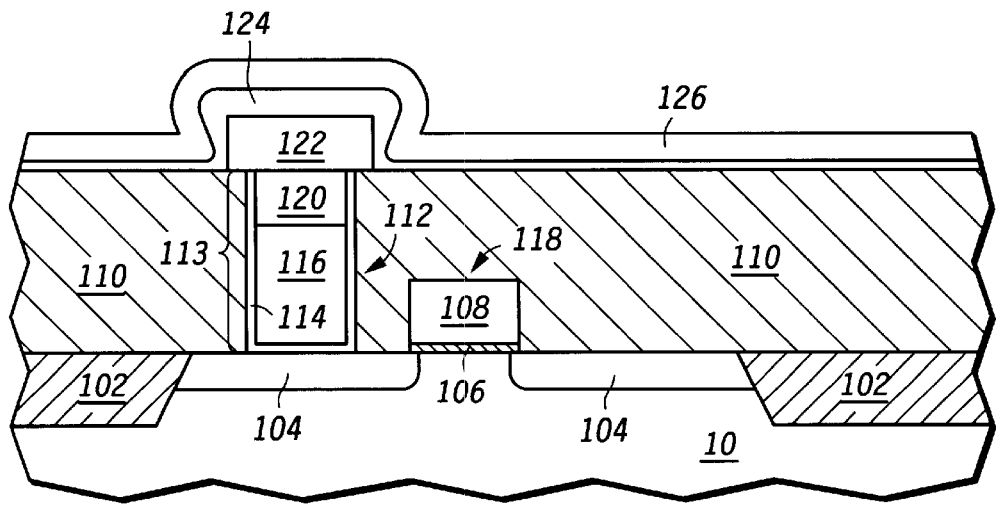
FIG. 1 includes an illustration of a prior art cross-sectional view of a portion of a semiconductor device substrate after forming a capacitor electrode.
Figure 2:
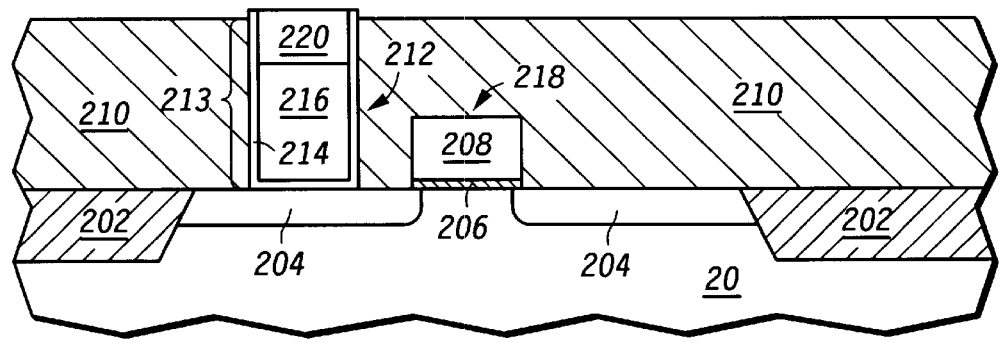
FIGS. 2–6 include an illustration of cross-sectional views of successive steps of the method of forming a capacitor according to embodiments of the present invention.

FIG. 2 includes an illustration of a semiconductor device that has been partially processed to define a conductive plug. As shown, the partially processed semiconductor device includes a semiconductor device substrate 20, field isolation regions 202, a transistor 218, conductive plug 213, and a dielectric film 210. Transistor 218 comprises doped regions 204, a gate dielectric film 206, and a gate electrode 208. As used in this specification, the semiconductor device substrate 20 comprises a mono-crystalline semiconductor wafer, a semiconductor on insulator substrate, or any other substrate used to form a semiconductor device.

In one embodiment, the gate electrode 208 is a layer of polysilicon. Alternatively, gate electrode 208 may be a metal layer such as tungsten or molybdenum, a metal nitride layer such as titanium nitride or tungsten nitride, or a combination thereof. In addition, gate electrode 208 may be a polycide layer comprising a metal silicide such as tungsten silicide, titanium silicide or cobalt silicide, overlying a polysilicon layer.

Following formation of the gate electrode, a dielectric film 210 is formed over the semiconductor device substrate 10 and patterned to form a contact opening. In one embodiment, dielectric film 210 is a layer of plasma deposited oxide that is formed using tetraethoxysilane (TEOS) as a source gas. Alternatively, dielectric film 210 may be a layer of silicon nitride, a layer of phosphosilicate glass (PSG), a layer of boro-phosphosilicate glass (BPSG), a silicon oxynitride layer, a polyimide layer, a low-K dielectric, or a combination thereof.

A contact opening is formed in the dielectric film 210 and a conductive plug 213 is formed within the contact opening. Conductive plug 213 is formed using an adhesion/barrier film 214 such as titanium/titanium nitride, tantalum/tantalum nitride, and the like. A conductive film material 216, such as tungsten or polysilicon, and the like, and an oxygen barrier material 220, such as iridium, is formed within the contact opening. After deposition, portions of the conductive film material 216 and underlying adhesion/barrier material 214 are removed using a conventional etch or chemical mechanical polishing process to form a conductive plug. Top portions of the conductive plug are then selectively etched back to form a recess in the contact opening. The etch is performed using a conventional etch process having adequate selectivity to the dielectric layer 210 to remove approximately 200 nanometers of conductive plug material from the uppermost portion of the plug opening.

An oxygen barrier material is then deposited over the surface of the substrate and within the contact opening to completely fill the contact opening. Typically the oxygen barrier material 220 is formed using other conductive materials which may include noble metals, metals that are capable of forming conductive metal oxides, and conductive metal oxides, conductive metal nitrides, metal borides, metal carbides, and the like. Examples of these include iridium, ruthenium, iridium oxide, ruthenium oxide, titanium nitride, titanium aluminum nitride, titanium silicon nitride, tantalum nitride, tantalum aluminum nitride, tantalum silicon nitride. After deposition, portions of the oxygen barrier material are removed using conventional etch or CMP processes to form the conductive plug 213. Up to this point in the process, conventional methods have been used to form the device shown in FIG. 2.

Figure 3:
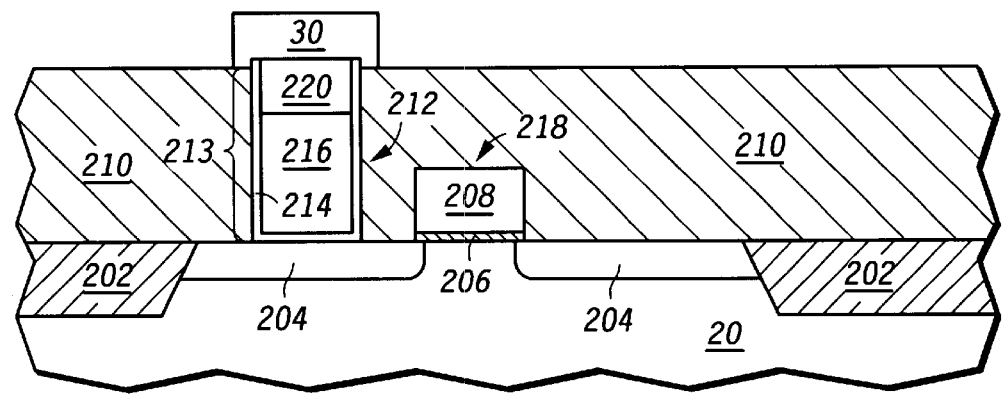

Shown in FIG. 3, is a bottom electrode post structure formed over the contact opening 113. In one embodiment, the bottom electrode post 30 is formed using platinum. Alternatively, the bottom electrode post is formed using noble metals or other metals that are capable of forming conductive metal oxides, and conductive metal oxides and conductive metal nitrides. Examples of these include iridium, palladium, ruthenium, iridium oxide, ruthenium oxide.

In one embodiment, the bottom electrode material used to form electrode post 30 is deposited using PVD. Alternatively, the bottom electrode material is formed using CVD, electroplating, or electroless plating. After depositing the material used to form the electrode post, it is then etched using a conventional plasma etch process to form the electrode post 30 as shown in FIG. 3.

Figure 4:
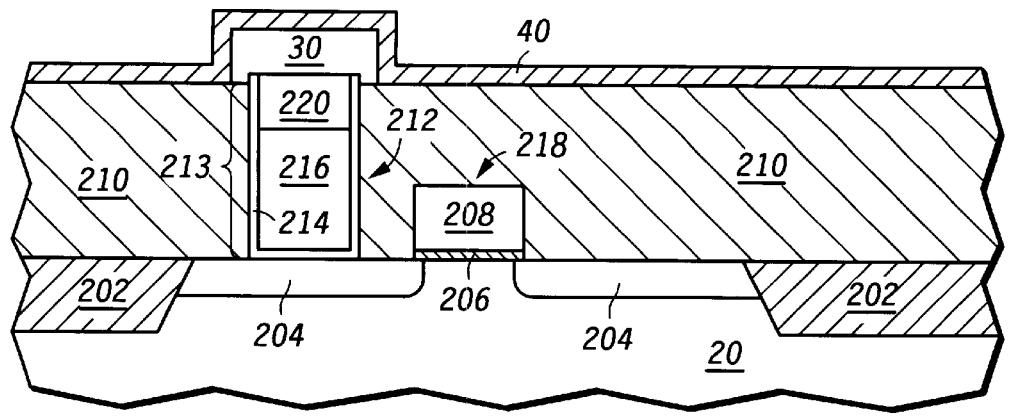

FIG. 4 further illustrates the device shown in FIG. 3 and now includes a capacitor dielectric film 40 formed over the bottom post electrode 30. In accordance with embodiments of the present invention, the capacitor dielectric film 40 formed of a high-K dielectric material formed using a CVD deposition process. According to a particular development of the illustrated embodiment, the CVD deposition process incorporates a technique of alternatively turning off and on reactive species during the deposition in order to improve the step coverage of the dielectric over the bottom electrode 30. In accordance with the embodiments of the present invention, deposition is typically performed at temperatures greater than 500 degrees Celsius, such as within a range of approximately 500 to 700 degrees Celsius, preferably within a range of approximately 550 to 625 degrees Celsius. In the prior art, at these temperatures, deposition is controlled by mass transport and the resulting step coverage is poor. By alternately turning reactive species off and on according to embodiments of the present invention, the reactants can diffuse uniformly around the feature before reacting to form the end-product dielectric material. In embodiments where barium strontium titanium oxide is the resulting deposited film, a first reactant containing barium, strontium and titanium precursors, and a second reactant containing an $O_2/N_2O$ mixture can be alternately turned off and on. Other high-K dielectric materials such as lead zirconate titanate and tantalum pentaoxide may also be utilized.

As shown in FIG. 4 electrode post 30 forms a step having a substantially vertical portion or surface and a substantially horizontal portion. The illustrated dielectric layer has optimal step coverage, having a ratio of thickness of the layer on the vertical portion to the horizontal portion of approximately 1:1. According to embodiments of the present invention, that ratio is advantageously greater than approximately 1:2 (one-half thickness on vertical sidewall as compared to horizontal top surface), such as 1:1 as shown in FIG. 4.

Figure 7:
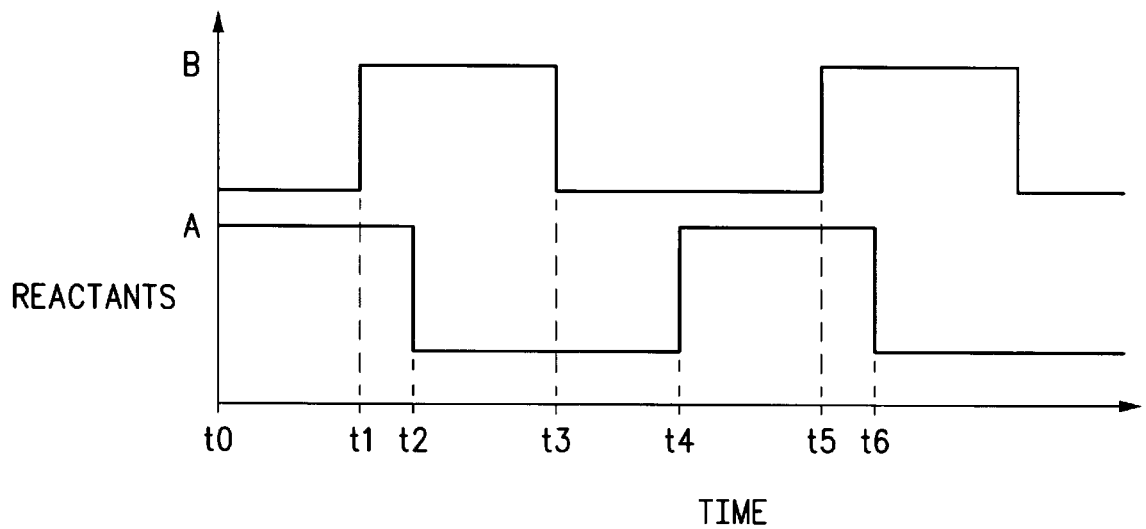
FIGS. 7–8 illustrate graphs of timing sequences of flow of reactants during a chemical vapor deposition process in accordance with embodiments of the present invention.
Figure 8:
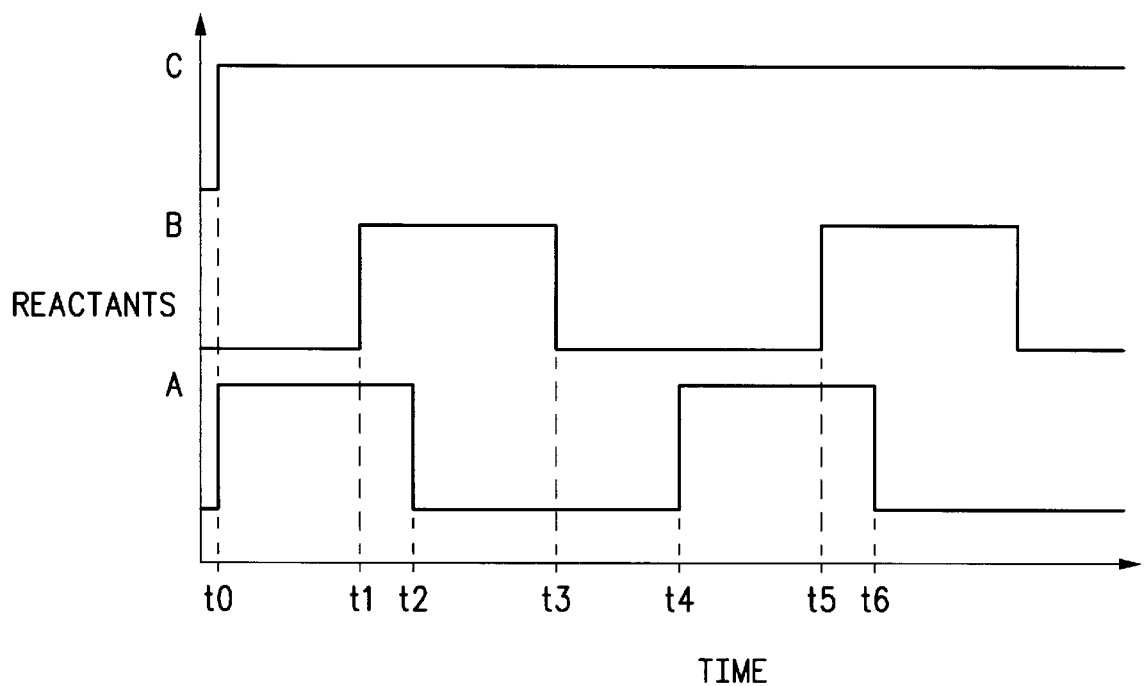

Shown in FIGS. 7–8 are embodiments of the present invention illustrating timing sequences for a CVD deposition process. FIG. 7 shows a gas flow chart of two reactants A and B, alternately being turned on and off, over a period of time during a deposition process. It is noted that terms "first reactant A" and "second reactant B" may each refer to a group of materials that are being pulsed into the chamber together from a single source, such as an $O_2/N_2$ gas mixture.

Gas flows for the reactants A and B are shown on the Y axis and time (t) is indicated on the X axis. In accordance with embodiments of the present invention, at time t0 first reactant A is turned on and second reactant B remains off. During the time interval t0–t1, which may be between approximately 0.1 to 10 seconds, reactant A uniformly diffuses over the feature surface. At time t1, the reactant A is turned off and B is turned on. During the time that reactant B is turned on, the reactant B combines with reactant A to form the product (fully reacted) film that is deposited over the feature surface. At time t3, reactant B is turned off. No process reactants flow in the chamber during interval t3–t4. During this interval, surface reaction products have time to diffuse on the surface and improve film quality and conformality. At time t4, reactant A is once again turned on and the pulsing sequence continues. This pulsing sequence, or alternately turning off and on the process gases, continues (e.g., at least 10 cycles) until the film is deposited to the desired thickness. Thus, in general, the pulsing sequence allows for only a partial set of reactants to uniformly diffuse across the feature surface, during which time chemical reaction occurs in conjunction with surface diffusion, and reaction at the surface to form reaction products that may diffuse across the feature. The pulsing times can be optimized to ensure completeness of reaction and adequate surface diffusion.

Stated alternatively, reactant A is flowed at a first flow rate at t0 (corresponding to the "on" position), is reduced in flow to a second flow rate at t1 (corresponding to the "off" position), and is flowed at a third flow rate at time t4 (corresponding to the "on" position). In this particular embodiment, the second flow rate equals approximately zero. It is noted that while FIG. 7 shows discrete, binary on-off positions, flow rates do not change instantaneously with the switching between on and off gas flows. Accordingly, the change in flow rates can be better modeled as ramp-up and ramp-down curves. While the first and third flow rates are substantially equal, they may differ as desired by the artisan. Like reactant A, reactant B is flowed in an intermittent manner, at a fourth flow rate at t1, a fifth flow rate at t3, and a sixth flow rate at t5.

Generally reactants A and B are turned on or off for relatively short durations, such as approximately 0.1 to 10 seconds. In addition, deposition is carried out in a vacuum chamber, where vacuum (sub-atmospheric pressure) is not broken during the deposition steps. The sub-atmospheric pressure is generally greater than $1E10^{-4}$ Torr, such as within a range of approximately 0.1 to 50 Torr.

In one embodiment(not shown), only reactant A is pulsed while reactant B flows at a constant flow rate. This approach favors surface reaction product diffusion across a feature in intervals when A is turned off. Examples of the reactants used during the deposition process include materials such as barium strontium titanium as reactant A, particularly b-diketonate, and an O2/N2O gas mixture as reactant B.

Alternatively, in another embodiment (FIG. 8), a third reactant could be allowed to flow in the chamber. For example, O2/N2O and two reactants such as titanium and barium strontium precursors, can be independently pulsed to deposit the film. This example again shows that the reactants A and B are being turned on and off as indicated by their position on the Y axis while reactant C is always turned on. As previously described in the case of BST, examples of the reactants include barium and strontium as one reactant, titanium precursor as second reactant B, and O2/N2O as the third reactant C.

In FIG. 8, at time t0 reactant A is turned on and reactant B is turned off. Reactant C is always turned on. Once reactant A is turned on it diffuses across the feature surface until time t1, reactant B is turned on and the reactants A and B combine to form the deposited film on the feature surface. Between time t1 and t2, both reactants A and B are turned on and the deposition occurs. Between t2 and t3, flow of B is continued to completely react with reactant A that has diffused along the surface feature. At time t2, reactant A is turned off and reactant B remains on. During the time interval t3 to t4, surface diffusion of reaction products occurs in addition to completion of surface reactions. This pulsing sequence is continued until the required film thickness is reached.

During the deposition process the flow of the reactants A and B are chosen such that they are timed to be at various on and off phases with respect to each other. Pulsing times can be selected so that sufficient diffusion of the reactant species takes place before the reaction of the reactant species occurs. In this way, reactants are allowed to distribute themselves across the feature surface before reacting and depositing on the feature, thereby improving the step coverage and the uniformity of the film across the feature surface.

Embodiments of the present invention can be used when depositing multicomponent films at high temperatures. In cases where BST is the deposited film, the reactants could include a barium strontium precursor, a titanium precursor, and the $O_2/N_2O$ mixture. Other examples of multicomponent films could include strontium titanate (STO), lead zirconate titanate (PZT), strontium bismuth tantalate (SBT), and tantalum pentoxide ($Ta_2O_5$).

Figure 5:
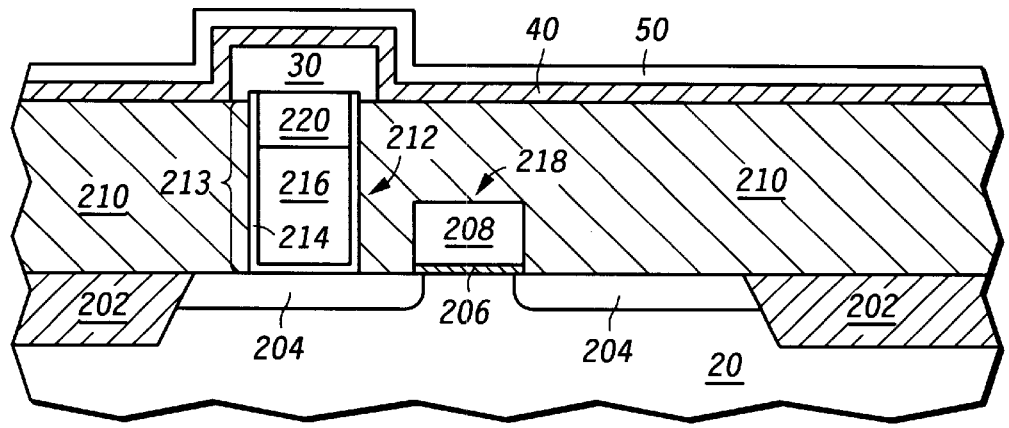

FIG. 5 further includes a conductive film 50 formed overlying portions of the capacitor dielectric film 40. The conductive film 50 is formed using materials and processes similar to those described previously to form the lower capacitor electrode 30. The two capacitor electrodes 30 and 50 can include the same or different conductive materials. The combination of the lower capacitor electrode, the capacitor dielectric 40 and the upper capacitor electrode 50 form a capacitor. Shown in FIG. 6, an insulating layer 60 is formed over the upper capacitor electrode 50. The combination of the upper capacitor electrode 50, the capacitor dielectric film 40 and the lower electrode 30 forms a capacitor. The combination of the transistor 218, the oxygen barrier material 220 and conductive film material 216 (the storage node), and the capacitor form a typical dynamic random access memory (DRAM) bit cell. Other electrical connections may be made but are not shown in FIG. 6. Also, other interlevel dielectric layers and interconnect levels may be present to form a more sophisticated semiconductor device.

Figure 6:
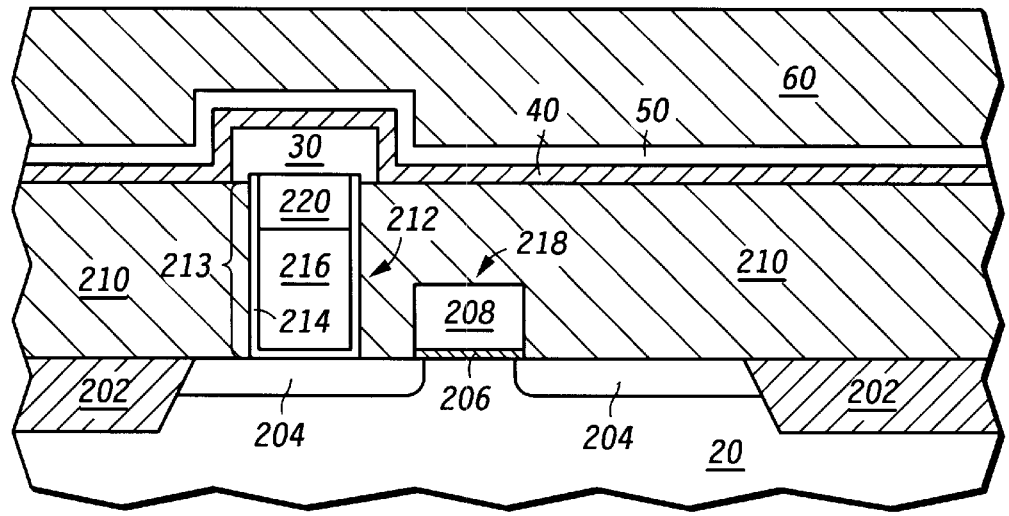

It is noted that FIG. 6 includes a device having a completed capacitor structure according to the bottom electrode configuration shown in FIG. 4. However, capacitor structures may also be completed similarly for other bottom electrode configurations that could include crown and inlaid structures. Those skilled in the art understand the advantages and various methods for forming those capacitor structures.

Methods for depositing dielectric materials are known in the art. Embodiments of the present invention make use of alternating the timing sequences for turning off and on reactants in a CVD process to improve the uniformity of the deposited film over feature surfaces. In the prior art, one currently used method for improving step coverage of deposited films includes depositing the films at a lower temperature. This requires the use of additional annealing at high temperatures in order to improve the crystallinity of the dielectric material. This increases processing complexity and introduces other integration issues.

Using embodiments of the present invention, the step coverage of a multicomponent high dielectric film is accurately controlled during deposition at high temperatures. Additional advantages include that because the film was deposited at a high temperature, carbon and other impurities are volatilized and therefore are not incorporated into the film. In addition, at a higher temperature, higher deposition rates can be achieved and improved crystallinity of the finally deposited film results. In addition, the advantage of using embodiments of the present invention will become increasingly more important as the aspect ratio of the features increase. In addition, this strategy for depositing multicomponent and single component films can be incorporated into any CVD deposition process and used as a processing parameter by which the film quality and step coverage can be controlled. It is not limited to uses of only high-K dielectric films, but any films deposited by CVD. Thus, it is apparent that there has been provided, in accordance with embodiments of the present invention, a capacitor structure and a process for forming the capacitor dielectric that provide advantages over the prior art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. In the claims, means plus function clauses, if any, cover the structures described herein that perform the recited functions. The means plus functions clauses also cover structural equivalence and equivalent structures that perform the recited functions.

What is claimed is:

1. A method of forming a semiconductor device comprising the steps of:
   providing a semiconductor substrate;
   forming a feature on the semiconductor substrate, wherein the feature forms a step having a vertical portion and a horizontal portion, the layer is deposited so as to overlie the step, and a ratio of thickness of the layer on the vertical portion to the horizontal portion is greater than approximately 1:2;
   placing the semiconductor substrate in a vacuum chamber and subjecting the semiconductor substrate to a sub-atmospheric pressure; and
   depositing a dielectric layer over the step of the feature on the semiconductor substrate while maintaining said sub-atmospheric pressure by sequentially (i) flowing a first reactant into the vacuum chamber at a first flow rate, (ii) reducing flow of said first reactant into the vacuum chamber to a second flow rate, and (iii) increasing flow of the first reactant into the vacuum chamber to a third flow rate.

2. The method of claim 1, wherein the steps (i) through (iii) are repeated at least ten times.

3. The method of claim 1, wherein the second flow rate is approximately zero, by turning off flow of the first reactant.

4. The method of claim 3, wherein the first and third flow rates are substantially equal.

5. The method of claim 1, wherein the first, second and third flow rates are each maintained for a duration of 0.1 to 10 seconds.

6. The method of claim 1, further comprising (iv) flowing a second reactant into the vacuum chamber at a fourth flow rate after initiating (i) flowing the first reactant.

7. The method of claim 6, wherein the fourth flow rate is maintained for a duration of 0.1 to 10 seconds.

8. The method of claim 6, wherein the step of (iv) flowing the second reactant is initiated after initiation of the step of (ii) reducing flow of the first reactant, such that flow of the first reactant and flow of the second reactant do not overlap each other.

9. The method of claim 6, wherein the step of (iv) flowing the second reactant is initiated prior to completion of the step of (i) flowing the first reactant, such that flow of the first reactant and flow of the second reactant overlap each other.

10. The method of claim 6, further comprising a step of (v) reducing flow of the second reactant to a fifth flow rate, wherein the step of (v) reducing flow of the second reactant is carried out before step (iii) increasing flow of the first reactant.

11. The method of claim 6, further comprising a step of (v) reducing flow of the second reactant to a fifth flow rate, wherein the step of (v) reducing flow of the second reactant is carried out after initiation of step (iii) increasing flow of the first reactant, such that the first and second reactants flow into the vacuum chamber at the same time.

12. The method of claim 1, further comprising (iv) flowing a second reactant into the vacuum chamber during the steps (i) through (iii).

13. The method of claim 12, wherein the step of (iv) flowing the second reactant is carried out at a substantially constant flow rate.

14. The method of claim 1, wherein the sub-atmospheric pressure is greater than approximately $1E10^{-4}$ Torr.

15. The method of claim 14, wherein the sub-atmospheric pressure is within a range of approximately 0.1 to 50 Torr.

16. The method of claim 1, wherein the dielectric material comprises a barium strontium titanate.

17. The method of claim 16, further comprising flowing a second reactant into the vacuum chamber, the first reactant comprising b-diketonate and the second reactant comprising $O_2$.

18. The method of claim 17, wherein the second reactant further comprises $N_2O$.

19. The method of claim 16, wherein the semiconductor substrate includes a bottom electrode layer, and the dielectric material is deposited on the bottom electrode layer.

20. The method of claim 19, further comprising a step of depositing a top electrode layer on the dielectric material to form a capacitor.

21. The method of claim 1, wherein the dielectric material comprises a lead zirconate titanate.

22. The method of claim 1, wherein the dielectric material comprises a strontium bismuth tantalate.

23. The method of claim 1, wherein the dielectric material comprises tantalum pentaoxide.

24. The method of claim 1, wherein the step of depositing the layer is carried out at a temperature of approximately 500 to 700° C.

25. The method of claim 24, wherein the temperature is within a range of approximately 550 to 625° C.

* * * * *